(12) United States Patent
Wang et al.

(10) Patent No.: US 7,259,562 B2
(45) Date of Patent: Aug. 21, 2007

(54) RF COIL FOR A HIGHLY UNIFORM B1 AMPLITUDE FOR HIGH FIELD MRI

(75) Inventors: Zhiyue J. Wang, Pearland, TX (US); Dah-Jyuu Wang, Doylestown, PA (US)

(73) Assignee: Baylor College of Medicine, Houston, TX (US)

( * ) Notice: Subject to any disclaimer, the term of this patent is extended or adjusted under 35 U.S.C. 154(b) by 31 days.

(21) Appl. No.: 11/352,770

(22) Filed: Feb. 13, 2006

(65) Prior Publication Data
US 2006/0181277 A1    Aug. 17, 2006

Related U.S. Application Data

(60) Provisional application No. 60/679,804, filed on May 11, 2005, provisional application No. 60/652,274, filed on Feb. 11, 2005.

(51) Int. Cl.
*G01V 3/00* (2006.01)
(52) U.S. Cl. .................. 324/318; 324/322; 600/422
(58) Field of Classification Search ................ 324/318, 324/322; 600/422
See application file for complete search history.

(56) References Cited

U.S. PATENT DOCUMENTS

| | | | |
|---|---|---|---|
| 5,804,969 A * | 9/1998 | Lian et al. | 324/318 |
| 6,177,797 B1 * | 1/2001 | Srinivasan | 324/318 |
| 6,313,633 B1 * | 11/2001 | Boskamp | 324/319 |
| 6,768,303 B1 * | 7/2004 | Su et al. | 324/309 |
| 6,894,496 B2 * | 5/2005 | Molyneaux et al. | 324/318 |

OTHER PUBLICATIONS

Alsop et al., "A Spiral Volume Coil for Improved RF Field Homogeneity at High Static Magnetic Field Strength," *MRM*, 40: 49-54, 1998.
Berenger, "A Perfectly Matched Layer for the Absorption of Electromagnetic Waves," *Journal of Computational Physics*, 114:185-200, 1994.
Collins et al., "Different Excitation and Reception Distributions With a Single-Loop Transmit-Receive Surface Coil Near a Head-Sized Spherical Phantom at 300 MHz," *Magnetic Resonance in Medicine*, 47: 1026-1028, 2002.
Foo et al., "Reduction of RF Penetration Effects in High Field Imaging," *Magnetic Resonance in Medicine*, 23: 287-301, 1992.
Hoult, "Sensitivity and Power Deposition in a High-Field Imaging Experiment," *Journal of Magnetic Resonance Imaging*, 12: 46-67, 2000.
Ibrahim et al., "Effect of RF coil excitation on field inhomogeneity at ultra high fields: A field optimized TEM resonator," *Magnetic Resonance Imaging*, 19: 1339-1347, 2001.
Tropp, "Image brightening in samples of high dielectric constant," *Journal of Magnetic Resonance*, 167: 12-24, 2004.
Zhu, "Parallel Excitation With an Array of Transmit Coils," *Magnetic Resonance in Medicine*, 51: 775-784, 2004.

* cited by examiner

*Primary Examiner*—Louis M. Arana
(74) *Attorney, Agent, or Firm*—Fulbright & Jaworski LLP

(57) ABSTRACT

An array coil to achieve more uniform RF excitation for high field magnetic resonance imaging. In the preferred embodiment, the array coil has a plurality of transmit-composite elements distributed around the object to be imaged. A composite element comprises up to three current loops preferably orthogonal to each another. The array coil has the capability to shape the distribution of all three orthogonal components (x, y, and z) of the RF $B_1$ field.

20 Claims, 4 Drawing Sheets

US 7,259,562 B2

RF COIL FOR A HIGHLY UNIFORM B1 AMPLITUDE FOR HIGH FIELD MRI

CROSS-REFERENCE TO RELATED APPLICATIONS

This application claims priority to U.S. application Ser. No. 60/652,274 filed on Feb. 11, 2005 and to U.S. application Ser. No. 60/679,804 filed on May 11, 2005.

TECHNICAL FIELD

The invention is directed to an improved device and method for magnetic resonance imaging (MRI) of the brain or other body parts using an excitation array coil to produce a uniform $B_1$ field. Specifically, it is directed to a coil system for transmitting radio frequency magnetic field ($B_1$ field) in magnetic resonance imaging scanners.

BACKGROUND OF THE INVENTION

The trend of development of MRI technology has been to use magnets of increasing strengths. However, current high-field (static field $B_0$ strength approximately 1.5 T and higher) MRI technology is hampered by non-uniform B, amplitude distribution offered by conventional coil techniques. At high $B_0$ field strengths the size of the human brain or other body parts is no longer small in comparison to the wavelength of the RF inside tissues. For human brain imaging above 3 T, the center of the brain shows brighter image intensity compared with the periphery, due to wavelength effects. The Maxwell equations dictate that a single RF component ($B_x$ or $B_y$) cannot be uniform over a three-dimensional (3D) volume under these conditions. It is possible to manipulate the RF field distribution to make it more uniform in one plane but the field homogeneity along the perpendicular direction will decrease. Consequently, it has been very difficult to obtain a highly uniform 180° pulse through a large 3D sample volume. As used in the entire document, "field amplitude", "$B_1$ field amplitude" and "RF field amplitude" all mean the amplitude of the transverse component of the $B_1$ field unless specifically indicated otherwise, because the longitudinal component does not contribute to spin excitation.

Achieving uniform RF excitation in high field MRI scanners is not a trivial task. In the case of brain scans, because of the large relative dielectric constant of water in the tissue, images acquired with conventional volume coils show higher signal intensity at the center of the head. Although a totally homogeneous $B_1$ field is unattainable over a 3D volume, allowing phase variation in space can lead to improvement in the $B_1$ amplitude distribution. Modification of birdcage coils showed improvement in the homogeneity of RF excitation. Due to the short wavelength of the RF field inside the tissue, the field distribution is strongly affected by the shape of the object, and conventional hardware configurations do not provide optimal results at very high field strengths. Many approaches have been proposed to improve RF field homogeneity, including a multiple-port transverse electromagnetic (TEM) resonator driven with variable phase and amplitude at each port (*Magn Reson Imaging* 2001: 19: 1339-1347) and the use of an array coil to obtain uniform $B_x$ and $B_y$ in one plane (*J Magn Reson Imaging* 2000: 12: 46-67).

The RF magnetic field for spin excitation can be described by a steady state field $B(r,t)=B(r)\cdot e^{-i\omega t}$. Achieving uniform RF excitation in high field MRI scanners is desirable, but not a trivial task. Because of the large relative dielectric constant of water in the tissue, images acquired with conventional volume coils show higher signal intensity at the center of the head. (*J Magn Reson* 2004: 167: 12-24). Although a totally homogeneous $B_1$ field is unattainable (*J Magn Reson Imaging* 2000: 12: 46-67), allowing phase variation in space can lead to improvement in the $B_1$ amplitude distribution. Modification of birdcage coils showed improvement in the homogeneity of RF excitation. (*Magn Reson Med* 1992: 23: 287-301; *Magn Reson Med* 1998: 40: 49-54). Due to the short wavelength of the RF field inside the tissue, the field distribution is strongly affected by the shape of the object, and conventional hardware configurations are unable to provide optimal results at very high field strengths. Many approaches have been proposed to overcome this difficulty, including a multiple-port transverse electromagnetic (TEM) resonator driven with variable phase and amplitude at each port. (*Magn Reson Imaging* 2001: 19: 1339-1347). The use of an array coil to obtain uniform $B_x$ and $B_y$ field in one plane (*J Magn Reson Imaging* 2000: 12: 46-67) has also been proposed.

BRIEF SUMMARY OF THE INVENTION

The present invention is directed to an improved device and method for magnetic resonance imaging of tissue using an excitation array coil to produce a uniform magnetic field. The use of parallel excitation with an array of composite excitation elements containing current loops for generating the $B_{1z}$ field and current loops for independently shaping $B_{1x}$ and $B_{1y}$ fields is used to improve the homogeneity of RF excitation. For a lossless uniform medium, homogeneous transverse $B_1$ amplitude distribution in a 3D volume is allowed by Maxwell's equations. For a lossy medium, plane-wise homogeneous transverse $B_1$ amplitude is allowed. Using computer simulations, we have demonstrated that uniform RF amplitude in a 3D lossless and uniform medium can be obtained with the coils transmitting from inside the medium. We also demonstrate the use of this type of array coil under more realistic situations, where we transmit the RF power from air to a human head model in computer simulations employing the finite-difference time-domain numerical method. We construct analytic target $B_1$ field patterns with plane-wise uniform (equivalent to in-plane uniform in our terminology) transverse $B_1$ amplitude from the RF field generated by individual current loops. Therefore, we have shown the feasibility of this approach when applied to imaging human anatomy.

In one aspect of the present invention, there is an excitation coil for a magnetic resonance imaging instrument, said coil comprising: at least four current loops, wherein if one unit of electric current flows through one or more of said loops, said one or more loops has a magnetic dipole moment, and for each loop the distance between the loop center and the central transverse plane of said instrument is smaller than 60% of the distance between the loop center and the center of said instrument; and wherein all of the conditions a, b, and c are met: a) at least three of said at least four current loops each have an axis which cannot be moved into a common plane without altering the direction of said axis by at least 35 degrees when only one loop is allowed to alter the direction of its axis; b) each current loop has a position vector relative to the center of said instrument, and for at least one current loop the angular deviation of its axis is more than 20 degrees from the direction of its position vector; and, c) the axis of at least one current loop has an angular deviation of more than 22.5 degrees from the central transverse plane. In some embodiments, up to three (i.e., 1 to 3) of said at least four current loops comprise a composite excitation element. In some embodiments, the excitation coil comprises a plurality of composite excitation elements. In some embodiments, the excitation coil comprises 49 composite excitation elements. In some embodiments having a plurality of composite excitation elements, the current amplitude and phase is variable within each composite element. In some embodiments, the current amplitude and phase is variable within one or more current loops of one or more composite excitation elements. In some embodiments, the diameter of at least one of said at least four current loops is about 4.7 cm. In some embodiments, at least one of said current loops has a shape selected from the group consisting of circular, rectangular, and ellipsoidal. In some embodiments, at least one of said current loops are non-planar. In some embodiments, at least one of said current loops consist of one turn. In some embodiments, at least one of said current loops consist of a plurality of turns. In some embodiments, the current amplitude and current phase is variable within one or more current loops relative to one or more other current loops. In some embodiments, the array coil further comprises one or more current loops having a distance from the central transverse plane equal to or greater than 60% of the distance of said loops to the center of the instrument. In some embodiments having the current loop distance requirement described immediately above, the current amplitude and current phase is variable within one or more current loops relative to one or more other current loops.

In another aspect of the present invention, there is a method for creating a uniform RF excitation field in a high-field magnetic resonance imaging instrument, said method comprising: applying parallel RF excitation with an array coil, said array coil comprising: at least four current loops, wherein if one unit of electric current flows through one or more of said loops, said one or more loops has a magnetic dipole moment, and for each loop the distance between the loop center and the central transverse plane of said instrument is smaller than 60% of the distance between the loop center and the center of said instrument; and wherein all of the conditions a, b, and c are met: a) at least three of said at least four current loops each have an axis which cannot be moved into a common plane without altering the direction of said axis by at least 35 degrees when only one loop is allowed to alter the direction of its axis; b) each current loop has a position vector relative to the center of said instrument, and for at least one current loop the angular deviation of its axis is more than 20 degrees from the direction of its position vector; and, c) the axis of at least one current loop has an angular deviation of more than 22.5 degrees from the transverse plane. In some embodiments, the method further comprises the step of varying both current amplitude and current phase in one or more current loops.

In another aspect of the present invention, there is a high-field magnetic resonance imaging instrument comprising: a superconducting magnet to immerse an object to be imaged in a magnetic field $B_0$; a gradient coil to produce gradients in said $B_0$ magnetic field immersed in said object; an RF coil to create a $B_1$ field to rotate the net magnetization of the object, said RF coil comprising: at least four current loops, wherein if one unit of electric current flows through one or more of said loops, said one or more loops has a magnetic dipole moment, and for each loop the distance between the loop center and the central transverse plane of said instrument is smaller than 60% of the distance between the loop center and the center of said instrument; and wherein all of the conditions a, b, and c are met: a) at least three of said at least four current loops each have an axis which cannot be moved into a common plane without altering the direction of said axis by at least 35 degrees when only one loop is allowed to alter the direction of its axis; b) each current loop has a position vector relative to the center of said instrument, and for at least one current loop the angular deviation of its axis is more than 20 degrees from the direction of its position vector; and, c) the axis of at least one current loop has an angular deviation of more than 22.5 degrees from the central transverse plane; and, a detector to detect signals from said object to be imaged. In some embodiments, the high-field magnetic resonance imaging instrument has a magnetic field strength of approximately 1.5 T. In some embodiments, the high-field magnetic resonance imaging instrument has a magnetic field strength of approximately 3.0 T. In some embodiments, the high-field magnetic resonance imaging instrument has a magnetic field strength of greater than 3.0 T.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Figure 1:
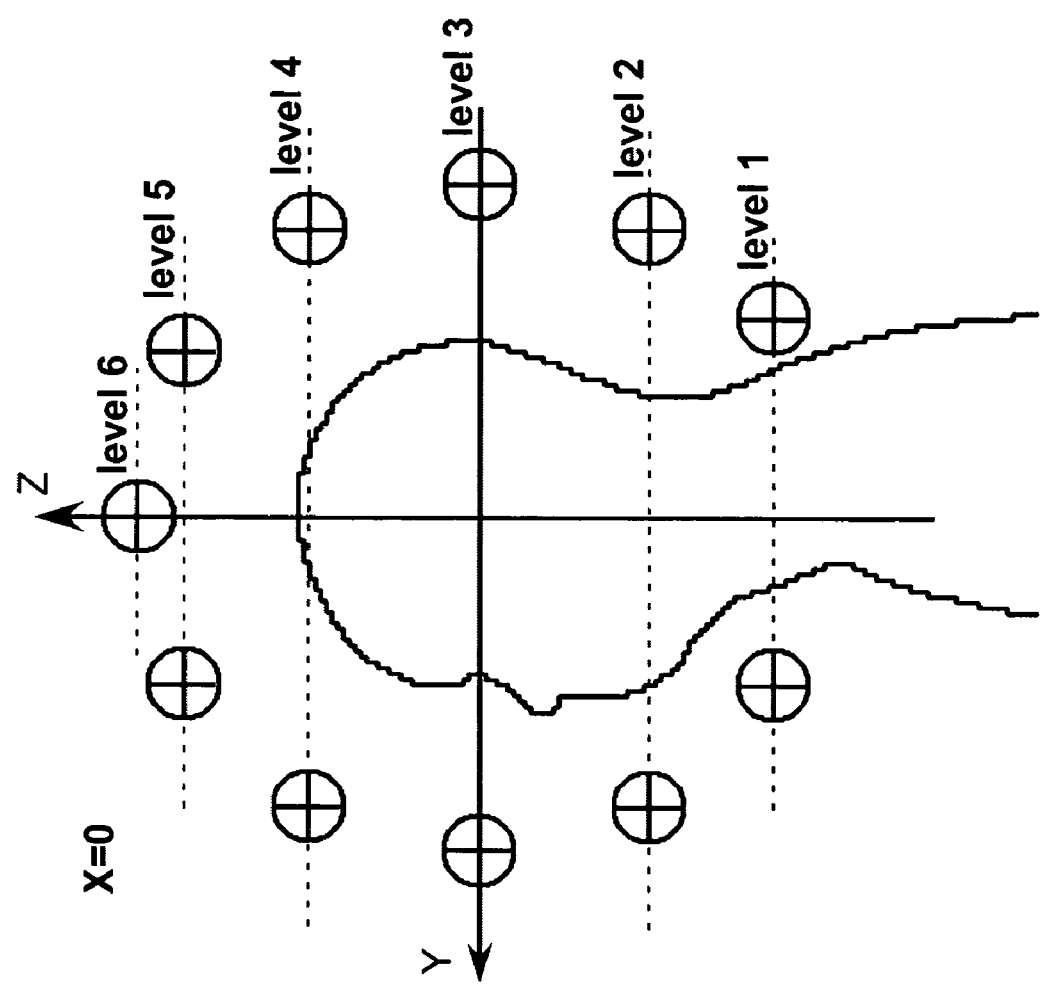
FIG. 1 illustrates the configuration of a head transmit array coil. The locations of the excitation composite coil elements on the yz-plane are shown. In this case, each composite element has three loops centered in the same location whose axes are along x, y and z directions, respectively.

As used herein, "a" or "an" means one or more.

As used herein, the term "axis" is defined herein with respect to a current loop and is that axis which is aligned with the dipole moment and through the center of dipole field pattern that exists when current flows through the loop. The direction of the axis is the direction of the dipole moment.

As used herein, the term "central transverse plane" is the transverse plane through the iso-center of the magnet of the magnetic resonance imaging instrument, or the center of the object to be imaged.

As used herein, the term "central axis" is the axis along the direction of the $B_0$ field, through the iso-center of the magnet magnetic resonance imaging instrument, or the center of the object to be imaged.

As used herein, the term "center" as that term is applied to a current loop is defined as the center of the dipole field pattern generated by current flow through the loop.

As used herein, the term "magnet" refers to the magnet of a magnetic resonance imaging instrument. When used in reference to the spatial configuration of the current loops of an array coil, the term magnet is synonymous with the magnetic resonance imaging instrument itself. In this context, the term "central transverse plane of the magnet" and the term "central transverse plane of the instrument" are synonymous. Similarly, the term "iso-center of the magnet" and the term "iso-center of the instrument" are synonymous.

As used herein, the terms "x-axis", "y-axis", and "z-axis", refer to the x, y, and z axes, respectively, of the magnetic resonance imaging instrument. $B_y$ defined the x, y, and z axis of the magnet in this way, this forms and xyz coordinate system. The origin of this coordinate system is at the magnetic iso-center of the magnetic resonance imaging instrument (i.e., the iso-center of the magnet). We have defined the center of each current loop above. The center of the ith current loop has coordinate $x_i$, $y_i$ and $z_i$. The "position vector" of the ith loop is defined with respect to its center and is $r_i=(x_i, y_i, z_i)$. Accordingly, each current loop has a position vector in the coordinate system.

At high static magnetic field strengths ($B_0$ field at 1.5 Tesla (T) and above), generating uniform RF field excitation becomes increasingly difficult. This is related to decreasing wavelengths of the RF field. Using a array coil described by the inventors, the homogeneity of the field amplitude can be improved, and plane-wise homogeneous transverse $B_1$ field amplitude can be approximately attained in a 3D volume.

Herein we demonstrate the use of an excitation array coil comprising at least four current loops. The magnetic dipole associated with each loop has a center position and a direction, which is defined as the center position and the axis of the loop. Positive and negative directions of the coil axis are not distinguished. A current loop with a butterfly configuration is decomposed into multiple closed loop segments; each will be treated as one current loop with a center position and an axis. The static $B_0$ field is along the z direction, and the x and y directions are in the transverse plane. The x-axis may have an arbitrary angle with a horizontal plane if the z-axis is in a horizontal plane. The excitation array coil has at least one current loop with an axis having a component along the x direction, at least one current loop with an axis having a component along the y direction, and at least one current loop with an axis having a component along the z direction. The current loops are configured such that a weighted vector sum of the magnetic moments produced by all loops can be along any direction in the 3D space. In other words, all of the magnetic dipole moment vectors are not close to a coplanar condition. Three of the current loops in the excitation array coil, that are in close proximity (i.e., the distances between their centers are smaller than a quarter of the RF wavelength in the object to be imaged) and whose magnetic dipole moment vectors are not coplanar (and preferably orthogonal to each other), may be grouped together to make up a 3-loop "composite excitation element." A composite excitation element may also have only one or two loops, where two loops or one loop in a 3-loop composite excitation element are missing. Composite excitation elements are typically distributed to surround the object to be imaged. The vector $B_1$ field from each current loop is calculated using the finite difference time domain (FDTD) numerical method at the nuclear Larmor frequency. Analytical target RF field patterns with plane-wise uniform transverse $B_1$ field amplitude are derived and approximately constructed from the fields of individual current loops through a least squares procedure. As used herein, the term "excitation element" and "current loop" include both transmit only coil elements and transmit and receive coil elements.

The excitation coil of the present invention achieves a more uniform $B_1$ field amplitude than those of the prior art. The excitation coil has at least four current loops. Each of the at least four current loops of the excitation coil is associated with a magnetic dipole moment when one unit of electric current flows (i.e., one arbitrary unit) through the loop. The resulting dipole moments are $m_1$, $m_2$, $m_3$, ... $m_n$, respectively. For each loop, the distance between the loop center and the central transverse plane of the instrument (i.e., of the magnet) is smaller than 60% of the distance between the loop center and the center of the instrument; and all of the conditions a, b, and c are met: a) at least three of said at least four current loops each have an axis which cannot be moved into a common plane without altering the direction of said axis of by at least 35 degrees when the direction of the axis of only one loop is allowed to alter; b) each current loop has a position vector relative to the center of said instrument, and for at least one current loop the angular deviation of its axis is more than 20 degrees from the direction of its position vector; and, c) the axis of at least one current loop has an angular deviation of more than 22.5 degrees from the central transverse plane.

Preferably, for each current loop, the distance between the loop center and the central transverse plane of the magnet is smaller than 60% the distance between the loop center and the center of the magnet. At least three of the at least four current loops each have an axis which cannot be moved into a common plane without altering the direction of axis of one of said at least three current loops by at least 35 degrees when only one loop is allowed to alter its direction. The excitation coil also meets the condition that each loop has a position vector relative to the center of the instrument, and for at least one current loop the angular deviation of its axis is more than 20 degrees from the direction of its position vector. Additionally, the axis of at least one current loop has an angular deviation of more than 22.5 degrees from the central transverse axis.

In some cases, one or more z-coils may be further added and positioned near the polar region. This can be achieved by a configuration having one or more current loops with axis nearly along the static field direction (less than a 60 degree deviation from the central axis, preferably less than a 45 degree deviation from the central axis) distributed around the object to be imaged. The distance of the center of any one of said elements from the central transverse plane is equal or greater than 60% of the distance to the center of the magnet, such as in the case of FIG. 1.

In some embodiments, there is a plurality of composite elements positioned all around the central axis of the magnet.

In some cases, one or more xy-coils may be further added and positioned near the polar region. This can be achieved by a configuration having one or more current loops with axis deviate from the static field direction (more than a 30 degree deviation from the central axis, preferably more than a 45 degree deviation from the central axis) distributed around the object to be imaged. The distance of the center of any one of said elements from the central transverse plane is greater than or equal to 60% the distance to the magnet center.

The current loops may be of any shape, however, preferred shapes include circular, rectangular, and ellipsoid. A composite excitation element may have loops of one or more than one shape and/or size. The current loops may consist of one or more than one turn (i.e., windings). A composite excitation element may have loops of both one turn and more than one turn.

The center of the current loops may not be distributed on one surface, but may be distributed in a volume. A spherical shell is one example.

The array coil of the present invention can be used in any MRI method. Such method typically comprise applying parallel RF excitation with an array coil, the array coil comprising the array coil of the present invention.

The array coil of the present invention can be used in any magnetic resonance imaging instrument. Typical components of such instruments include a superconducting magnet to immerse an object to be imaged in a magnetic field $B_0$, a gradient coil to produce gradients in the $B_0$ magnetic field immersed in the object being imaged. The instrument also comprises an RF coil. The array coil of the present invention would then form at least a part of the RF coil to create a $B_1$ field to rotate the net magnetization of the object being imaged. Finally, the instrument comprises a detector to detect signals from said object being imaged. Although the invention may be applied to instruments of all field strengths, it is expected to be particularly useful in high field MRI applications.

The RF field patterns generated by the computer simulations closely followed the target field patterns. Highly uniform $B_1$ field amplitude was obtained within parallel sagittal planes or parallel axial-to-coronal oblique planes in the brain with the expected plane-to-plane variations. Patterns of $B_1$ amplitude distribution with a high degree of plane-wise homogeneity can be achieved simultaneously in multiple parallel planes in a 3D volume.

The inventors have recognized that there are analytical RF field patterns that can be utilized for MRI spin excitation. These patterns allow plane-wise homogenous RF field amplitude in an arbitrary orientation in a uniform medium. For example, the equations below describes a circularly polarized $B_1$ field pattern with uniform amplitude in sagittal planes provided that the constant $k_1$ is real (Field Pattern I):

$$B_{1x} = B_1 \cdot \cos(k_2 x) \cdot e^{ik_1 y}$$

$$B_{1y} = i \cdot B_1 \cdot \cos(k_2 x) \cdot e^{ik_1 y} \quad [1].$$

Both $B_{1x}$ and $B_{1y}$ satisfy the wave equation:

$$(\nabla^2 + k^2) B(r) = 0 \quad [2].$$

Here, $k_1$ is a real number, $k_1^2 + k_2^2 = k^2$ and $k^2 = i\omega\mu_0\sigma + \in \in_0 \mu_0 \omega^2$, where $\omega$ is the angular frequency of the $B_1$ field, $\in_0$ and $\mu_0$ are the dielectric constant and permeability of free space, respectively, and $\in$ and $\sigma$ are the relative dielectric constant and conductivity of the medium, respectively. Preferably, we choose a value of $k_1$ such that $|\cos(k_2 \cdot x)|$ has a minimum coefficient of variation for a range of x values. We may also consider uniform $B_1$ amplitude in an oblique orientation. In this instance, it is convenient to transform into an oblique coordinate system o'x'y'z'. To simplify the calculation, we consider the special case where x' coincides with x:

$$x' = x$$

$$y' = y \cdot \cos(\theta) - z \cdot \sin(\theta) \quad [3].$$

$$z' = y \cdot \sin(\theta) + z \cdot \cos(\theta)$$

Here $\theta$ is a rotation angle. We wish to generate uniform $B_1$ amplitude in planes perpendicular to the z'-axis. The field pattern is given by (Field Pattern II):

$$B_{1x} = B_1 \cdot \cos(k_2 z') \cdot e^{ik_1 x'}$$

$$B_{1y} = i \cdot B_1 \cdot \cos(k_2 z') \cdot e^{ik_1 x'} \quad [4].$$

Here, the constants $k_1$ and $k_2$ can be chosen similarly to those in Eq. [1]. Note that the direction of the $B_1$ field is still defined in the original lab frame. For example, $B_{1x}$ in Eq. [4] is along the x-axis, not the x'-axis, etc. It can be verified that the field pattern given by Eq. [4] also satisfies Eq. [2]. Eq. [1] and Eq. [4] are only examples. There are many possible ways to have this class of field patterns. For example, $\cos(k_2 \cdot x)$ can be replaced by $\exp(i k_2 \cdot x)$ in Eq. [1], etc.

Although the RF field patterns described above are theoretically permitted by physics, physically realizing them is not trivial. Computer simulations using planar array coil configurations where the axes of all elements were parallel to a transverse plane failed to generate the desired field pattern. One aspect of the invention is allows for supplementation of the transverse field components in Eq. [1] and Eq. [4] with a longitudinal component:

$$B_{1z} = B_1 \cdot (z - z_0) \cdot [k_2 \cdot \sin(k_2 x) + k_1 \cdot \cos(k_2 x)] \cdot e^{ik_1 y} \quad [1'].$$

for Eq. [1] and $$B_{1z} = \frac{-i \cdot B_1}{\cos(\theta)} \cdot \left[ \frac{k_1}{k_2} \cdot \sin(k_2 z') + \sin(\theta) \cdot \cos(k_2 z') \right] \cdot e^{ik_1 x'}. \quad [4']$$

for Eq. [4]. In Eq. [1'], $z_0$ is a constant. Both Eqs. [1'] and [4'] also satisfy Eq. [2]. The z-component of the RF field is usually not desirable due to the fact that they do not directly contribute to spin excitation but contribute to the undesirable tissue heating. However, the longitudinal component is needed to satisfy Eq. [5]:

$$\nabla \cdot B(r) = 0 \quad [5].$$

In most cases, for a analytical field pattern of the transverse component of $B_1$ field, we need to supplement it with a longitudinal component. The longitudinal component also satisfies Eq. [2]. Together, all spatial components of the RF satisfy Eq. [5].

The prior art already includes the use of array coil configuration to generate more homogeneous RF field (*J Magn Reson Imaging* 2000: 12: 46-67). The transmit array in the prior art used planar coil elements configurations. That is, all radio frequency electric currents in the coil flow in a curved surface; i.e., the electric currents flow in two dimensions. The surface could be approximately the surface of a cylinder, a sphere, or other variations in shape. In the prior art designs, in a vicinity of the surface point where a loop element is centered, the RF field induced by the said element is along the direction of the surface normal direction only. At this location the loop element does not generate RF field component in the two other directions within the surface. Consequently, in prior art configurations, the transverse component of the RF $B_1$ field generated by individual elements do not comprise a complete basis set to generate all transverse field patterns allowed by Eq. [2]. One aspect of the invention is to supplement the prior art configuration with coil elements in which the current flows in three dimensions. That is, the current flows in and out of the surface where the 2D current flow of a prior art coil is confined. Typically, a current loop in a prior art design can be supplemented by up to two additional loops orthogonal to the original loop. These up to two newly added current loops can generate RF field components in up to two directions within the surface of the 2D current flow at the center of the original prior art coil element. The transverse component of the RF field from the newly added coil elements supplement that from the coil elements in the prior art transmit array coil, allows generation of more homogeneous transverse $B_1$ field amplitude because the new system is capable of shaping the z-component of the RF field described above, and also capable of shaping the x- and y-components of the RF field independently.

FIG. 1. demonstrates the configuration of a head transmit array coil. The locations of the excitation coil elements on the yz-plane are shown. The example uses composite coil elements. Each composite element comprise of three orthogonal current loops with the same center position. The human template constructed from MRI data is also shown. The center locations of all composite element of this array coil is listed in Table 1.

TABLE 1

The center positions of the transmission current loops.

| Level | z value (cm) [a] | x and y values (cm) |
|---|---|---|
| 1 | −19.9 | x = [−11.5, 0.0, 11.5, −11.5, 0.0, 11.5], y = [8.1, 11.5, 8.1, −13.8, −13.8, −13.8] |
| 2 | −11.5 | x = 19.9 · sin(nπ/6), y = 19.9 · cos(nπ/6), n = 0, 1, . . . , 11 |
| 3 | 0.0 | x = 23.0 · sin(nπ/6), y = 23.0 · cos(nπ/6), n = 0, 1, . . . , 11 |
| 4 | 11.5 | the same as Level 2 |
| 5 | 19.9 | x = 11.5 · sin(nπ/3), y = 11.5 · cos(nπ/3), n = 0, 1, . . . , 5 |
| 6 | 23.0 | x = 0.0, y = 0.0 |

[a] A positive z value denotes the superior direction (see FIG. 1).

Figure 2:
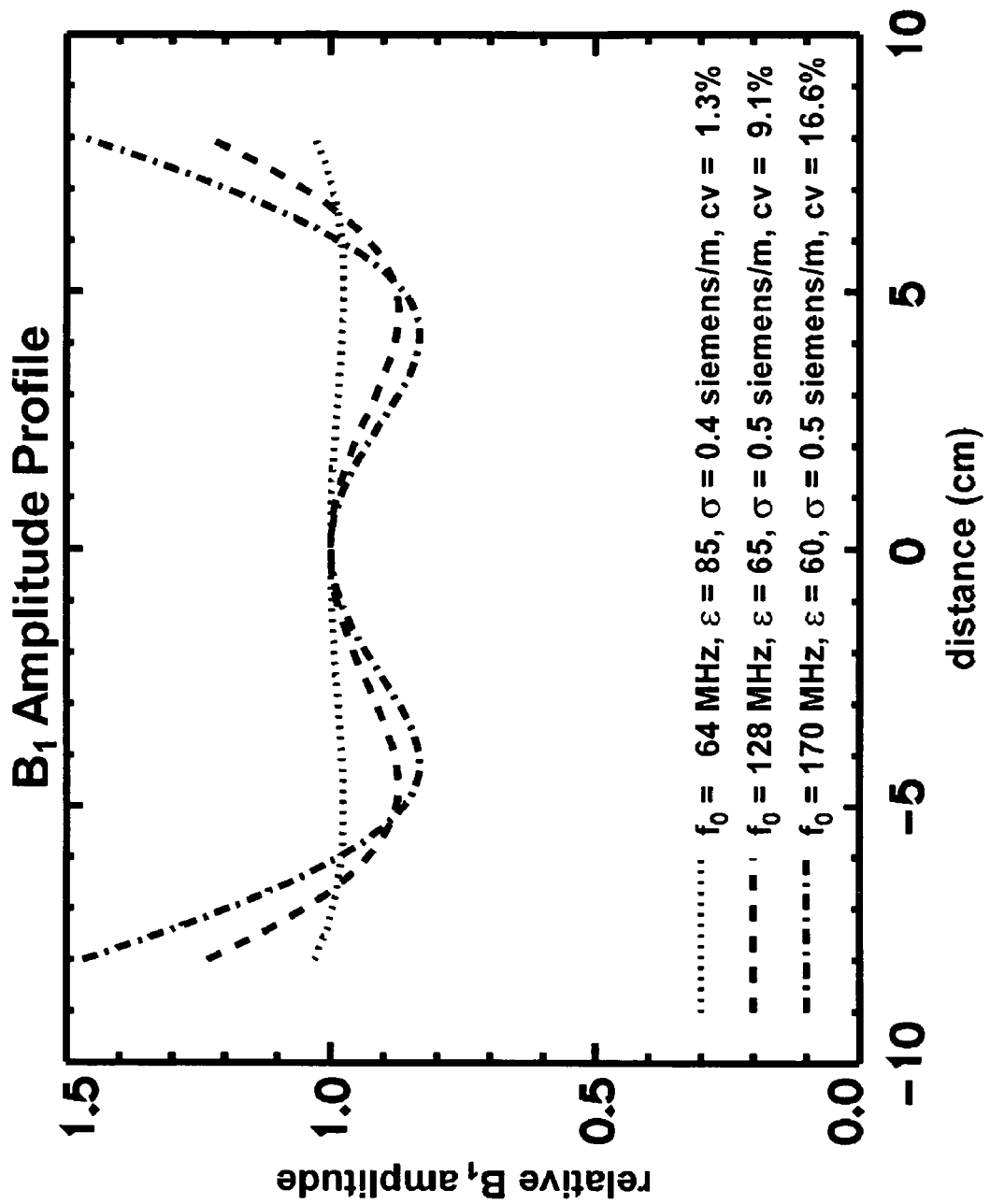
FIG. 2 illustrates the field profile showing possible $B_1$ amplitude variation from plane-to-plane.

FIG. 2 is a field profile showing possible $B_1$ amplitude variation from plane-to-plane. Variation of the transverse $B_1$ amplitude perpendicular to the uniform excitation planes for the target analytic RF Field Patterns I and II. The horizontal axis represents either x in Eq [1] or z' in Eq. [4]. The value of $k_1$ was optimized for each $B_0$ field to give the minimum coefficient of variation for $|\cos(k_2 \cdot x)|$ in the range from −8 cm<x<8 cm. (see Table 2 below).

Figure 3:
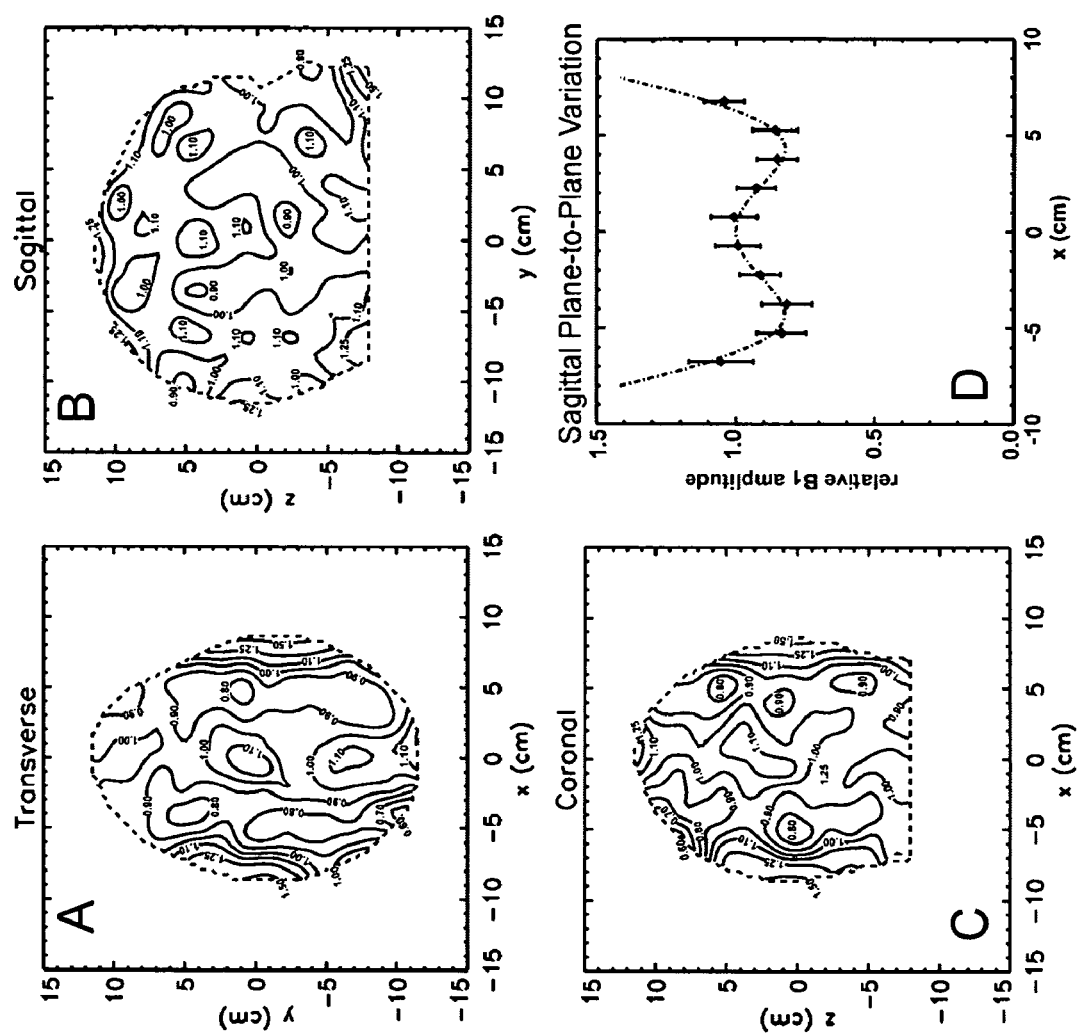
FIG. 3 demonstrates the simulated transverse circularly polarized (CP) $B_1$ amplitude in human brain (assuming $\sigma=0.5$ S/m and $\in=60$) at 170 MHz, using the target RF Field Pattern I with the field profile of FIG. 2.

FIG. 3 demonstrates the construction of a $B_1$ field the amplitude of which is approximately uniform in multiple parallel sagittal planes. The figure shows simulated transverse CP $B_1$ in human brain (assuming σ=0.5 S/m and ∈=60) at 170 MHz, using the target RF Field Pattern I with the field profile of FIG. 2. All sagittal plans with |x|<8 cm are targeted simultaneously for plane-wise homogeneous $B_1$ amplitude. FIG. 3(*a*) shows a contour plot of the CP $B_1$ amplitude in the transverse plane at z=0.75 cm. Because of the choice of lattice points for the numerical field calculation, there are no data points on the x=0, y=0, and z=0 planes. FIG. 3(*b*) shows a contour plot of the CP $B_1$ amplitude distribution in the sagittal plane at x=0.75 cm. FIG. 3(*c*) shows a contour plot of the CP $B_1$ amplitude distribution in the coronal plane at y=−0.75 cm. FIG. 3(*d*) shows the sagittal plane-to-plane variation of CP $B_1$ amplitude. The diamonds are the mean $B_1$ amplitude in sagittal planes. The error bars show the mean plus and minus one standard deviation, and the dotted dash line is the target field profile.

Figure 4:
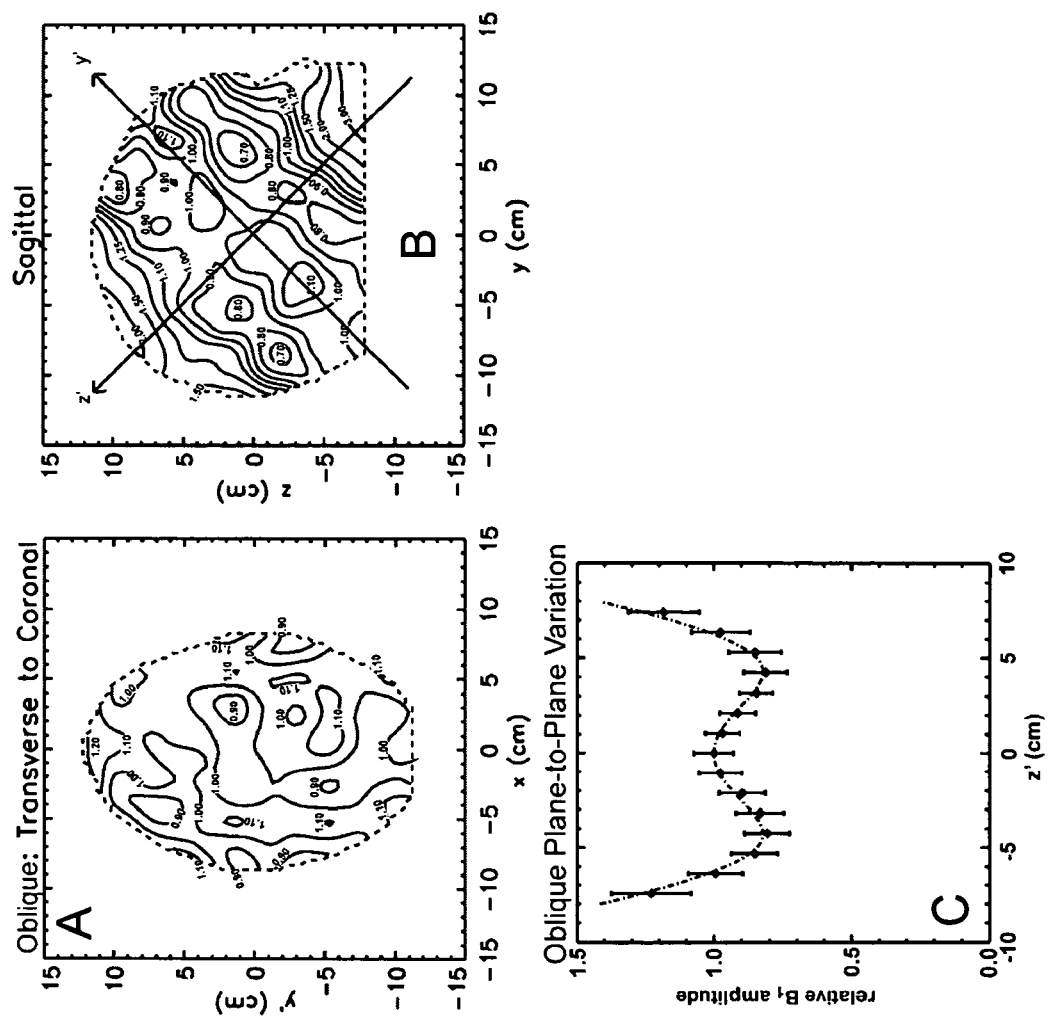
FIG. 4 shows the simulated transverse CP $B_1$ amplitude in human brain (assuming $\sigma=0.5$ S/m and $\in=60$) at 170 MHz, using the oblique target RF Field Pattern II with $\theta=-45°$ and the field profile of FIG. 2.

The construction of $B_1$ field amplitude which is approximately uniform in multiple parallel oblique planes is shown in FIG. 4. The figure shows simulated transverse CP $B_1$ amplitude in human brain (assuming σ=0.5 S/m and ∈=60) at 170 MHz, using the target RF Field Pattern II with θ=−45° and the field profile of FIG. 2. All oblique planes parallel to z'=0 with |z'|<6 cm are targeted for plane-wise homogenous $B_1$ amplitude. FIG. 4(*a*) shows a contour plot of the CP $B_1$ amplitude in the oblique plane at z'=0.0 cm. FIG. 4(*b*) shows a contour plot of the CP $B_1$ amplitude in the sagittal plane at x=0.75 cm. In FIG. 4(*c*), the CP $B_1$ amplitude for planes perpendicular to the z'-axis is shown. The diamonds are the mean field amplitude in each plane. The error bars show the mean plus and minus one standard deviation, and the dotted dash line is the target field profile.

EXAMPLE

Using computer simulation, we demonstrate the application of the present invention using an array coil configuration on a human head model. However, the invention is not limited to the human head application demonstrated below.

Array Coil Configuration

The transmit array consisted of 49 "composite excitation elements," each having three orthogonal circular current loops with axes parallel to the x, y and z directions, respectively. The diameter of each current loop was 4.7 cm. The center positions of all three loops in one composite excitation element were the same. The array transmitted from the air. The locations of the coils are listed in Table 1 and also demonstrated in FIG. 1 for the elements on the yz-plane. The $B_0$ field was along the z direction, and the positive z direction was from feet to head. The anterior aspect of the head corresponded to the positive y direction. The current loops were distributed at 6 different z levels. For Levels 2 through 6, the centers of all transmitting elements were distributed in a sphere with a radius of 23 cm. At the highest level (Level 6), there was only one composite element, located on the z-axis. For Levels 2 through 5, the composite elements were evenly distributed around the z-axis, with two composite elements located on the y-axis. The current loops at the lowest z level (Level 1) were near the shoulders. At this level the coils were not distributed on a circle to avoid intruding into the shoulders. The amplitude and phase of the electric current in each loop could be individually adjusted. The effects of coupling between the array elements on individually adjusting the currents could be minimized with, for example, current source driving.

Numerical Field Calculations

The RF field calculation was performed using the finite-difference time-domain (FDTD) method described by Yee (*IEEE Trans Antennas Propag* 1966: 14: 302-307) with self developed software written in IDL (version 5.6, Research Systems Inc, CO) running on a Dell Precision 340 workstation with Windows 2000. The simulations were performed on a 90×90×90 cm$^3$ volume that we refer to as the volume of calculation. At the center of this volume, (x,y,z) =(0,0,0). The grid size (distance between neighboring points in one direction) was 1.5 cm, and one cycle of the electromagnetic wave was broken into 250 time points. The simulation calculated the RF field inside a human head model at 170 MHz. The object was constructed based on multi-slice MR images of the head, neck and chest of an adult male. The chest reached the boundary of the volume of calculation, and the head was located at the center of the volume. This is a simplified model only to establish an outer perimeter of the human head, neck and chest without compartments of different dielectric constant and conductivity for different tissues and bones. The materials in the template were assumed to be uniform with a relative dielectric constant $\in$=60 and a conductivity σ=0.5 S/m. These values approximately correspond to the average of the gray and white matters at 170 MHz (AL/OE-TR-1996-0037 1996). The lungs inside the template were assumed to have properties of free space. The boundary conditions of the volume of calculation were set up using the method of "perfectly matched layers". (*Journal of Computational Physics* 1994: 114: 185-200). Five layers were used with a parabolic distribution of conductivities to minimize the reflection of the RF wave from the outer boundary. The outer boundary was assumed to be perfectly conductive.

The spatial distribution of the RF field from each current loop was calculated separately. In the simulation, the current in one loop oscillated for 6 cycles, and a steady state field distribution was reached before 4 cycles were completed. From the oscillation of the field at each spatial point during the last 2 cycles, the amplitude and phase of the RF fields $B_x$, $B_y$ and $B_z$ were obtained. The FDTD method uses shifted grid points for $B_x$, $B_y$ and $B_z$. Therefore, an interpolation routine consistent with Eq. [2] was written to obtain $B_x$, $B_y$ and $B_z$ in a common set of lattice points. The computer program for the finite difference time domain calculation was validated in a special case where the space is uniform. The FDTD results agreed with those obtained with the generalized Biot-Savart law:

$$B(r) = \mu_0 \int \left( \frac{(r-r') \times j(r')}{|r-r'|^3} \right) e^{ik \cdot |r-r'|} dr' - ik\mu_0 \int \left( \frac{(r-r') \times j(r')}{|r-r'|^2} \right) e^{ik \cdot |r-r'|} dr'. \quad [6]$$

A linear least squares procedure was used to construct the desired complex vector RF field patterns in the head, defined as regions with z>−8 cm in the template. The procedure used vector addition of the fields from all the loops. The linear least squares routine was tested using the complex vector field of each individual coil loop as the target field with phase equal to both 0° and 90°. The program precisely returned the known values for the current amplitude and phase in all loops.

The feasibility of parallel excitation for MRI with an array coil has been demonstrated experimentally with a limited number of array elements. (*Mang Reson Med* 2004: 51: 775-784). Practical implementations of transmit array coil are complicated by the couplings between the elements. Hardware development will allow simultaneous emission of RF power from multiple elements with minimum interference among each other. (*J Magn Reson* 2004: 171: 64-70). Utilizing current source driving has been demonstrated to be an effective way of controlling currents in each element independently. (*Proc. Intl. Soc. Mag. Reson. Med.* 2005: 13: 324, 13: 917.)

For the generation of Field Pattern I, the spatial region used for the least squares procedure was restricted to |x|<8 cm. For the generation of Field Pattern II, the spatial region used for the least squares procedure was restricted to |z'|<6 cm. There were a total of 294 variables involved in the least squares fit, including electric current amplitude and phase in each of all 49×3 loops. Finally, the circularly polarized $B_1$ field was obtained. The amplitudes of circularly polarized fields of both senses were calculated. First, the amplitude and direction of both the real and imaginary parts of vector $B_1$ in the xy plane were calculated. To get one CP field, the imaginary part of 0.5·$B_1$ was rotated clockwise 90° in one direction and added to the real part of 0.5·$B_1$. To obtain the second CP field, the imaginary part of 0.5·$B_1$ was rotated 90° counter-clockwise and superimposed with the real part of 0.5·$B_1$. This method for calculating the CP field is equivalent to that used in the literature. (*J Magn Reson Imaging* 2000: 12: 46-67, 47: 1026-1028.)

Analytic Target RF Field Pattern

The transverse $B_1$ amplitude profile was optimized over the distance range from −8.0 cm to 8.0 cm for x in Eq. [1] and z' in Eq. [4], for three field strengths from 1.5 T to 4 T for protons. The results are summarized in Table 2 and FIG. 2. The values for σ and $\in$ at each frequency are listed in Table 2 and were the averages of the gray and white matters at the corresponding frequency. (AL/OE-TR-1996-0037 1996). The $k_1$ value was varied to find the |cos($k_2$·x)| with the minimum coefficient of variation over the distance range. We perceive the field distributions plotted in FIG. 2 as representing the $B_1$ amplitude variation across a set of parallel planes, while in each plane the $B_1$ amplitude is uniform. The curves were obtained with $k_1$ yielding the minimum CV listed in Table 2. At lower field strengths this field pattern appears to provide a very homogeneous field distribution. As $B_0$ increases, the field amplitude variation over the distance range increases.

TABLE 2

Parameters used for RF amplitude profile in FIG. 2 and the variation of the resulting field amplitude.

| $B_0$ field strength (Tesla) | Proton Frequency (MHz) | Relative dielectric constant ($\epsilon$) | Conductivity ($\sigma$) (siemens/m) | Optimized $k_1$ | Coefficient of variation (%) |
|---|---|---|---|---|---|
| 1.5 | 64 | 85 | 0.4 | $0.87 \cdot \sqrt{Re(k^2)}$ | 1.3 |
| 3.0 | 128 | 65 | 0.5 | $0.70 \cdot \sqrt{Re(k^2)}$ | 9.1 |
| 4.0 | 170 | 60 | 0.6 | $0.71 \cdot \sqrt{Re(k^2)}$ | 16.6 |

RF Field Distribution in the Head Model

Computer simulations generated $B_1$ amplitude patterns that we hoped to achieve. FIG. 3 shows the CP $B_1$ field in three orthogonal planes at 170 MHz with the targeted field being Field Pattern I with $z_0=0$ in Eq. [1'] (the z position where $B_{1z}$ field is zero) and using parameters in Table 2. We anticipated variation in the field amplitude along the x direction according to FIG. 2, and constant $B_1$ amplitude perpendicular to the x-axis in sagittal planes. The calculated field pattern agrees with the expectation in general. The field distributions in transverse and coronal planes are not meant to be homogeneous (FIG. 3(a) and FIG. 3(c)). The coefficient of variation for the CP $B_1$ field for the sagittal plane in FIG. 3(b) is 8.2%. The mean and standard deviation of the $B_1$ amplitude for parallel planes at the location of lattice points is shown in FIG. 3(d).

The generation of oblique Field Pattern II is demonstrated in FIG. 4. In this case, $y'=(y+z)/\sqrt{2}$, $z'=(-y+z)/\sqrt{2}$ ($\theta="45°"$). FIG. 4(a) shows the CP $B_1$ contour in the $z'=0$ plane. FIG. 4(b) shows the CP $B_1$ amplitude map for a sagittal center plane. The $B_1$ amplitude distribution in sagittal planes is not optimal for Field Pattern II. FIG. 4(c) shows the mean and standard deviation of the relative $B_1$ amplitude within the brain in each plane perpendicular to the z'-axis. In all simulations, the calculated CP $B_1$ amplitude distribution was close to the target field patterns.

In conclusion, parallel RF excitation with an array coil can yield $B_1$ amplitude with a high degree of in-plane homogeneity in a 3D volume for high field MRI of the human brain.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An excitation coil for a magnetic resonance imaging instrument, said coil comprising:
   at least four current loops, wherein if one unit of electric current flows through one or more of said loops, said one or more loops has a magnetic dipole moment, and for each loop the distance between the loop center and the central transverse plane of said instrument is smaller than 60% of the distance between the loop center and the center of said instrument; and wherein all of the conditions a, b, and c are met:
   a) at least three of said at least four current loops each have an axis which cannot be moved into a common plane without altering the direction of said axis by at least 35 degrees when the direction of the axis of one loop only is altered;
   b) each current loop has a position vector relative to the center of said instrument, and for at least one current loop the angular deviation of its axis is more than 20 degrees from the direction of its position vector; and,
   c) the axis of at least one current loop has an angular deviation of more than 22.5 degrees from the central transverse plane.

2. The excitation coil of claim 1, wherein up to three of said at least four current loops comprise a composite excitation element.

3. The excitation coil of claim 2, comprising a plurality of composite excitation elements.

4. The excitation coil of claim 3, comprising 49 composite excitation elements.

5. The excitation coil of claim 3, wherein the current amplitude and phase is variable within each composite excitation element.

6. The excitation coil of claim 5, wherein the current amplitude and phase is variable within one or more current loops of one or more of said composite excitation element.

7. The excitation coil of claim 1, wherein the diameter of at least one of said at least four current loops is about 4.7 cm.

8. The excitation coil of claim 1, wherein at least one of said current loops has a shape selected from the group consisting of circular, rectangular, and ellipsoidal.

9. The excitation coil of claim 1, wherein at least one of said current loops are non-planar.

10. The excitation coil of claim 1, wherein at least one of said current loops consist of one turn.

11. The excitation coil of claim 1, wherein at least one of said current loops consist of a plurality of turns.

12. The array coil of claim 1, wherein the current amplitude and current phase is variable within one or more current loops relative to one or more other current loops.

13. The array coil of claim 1, further comprising one or more current loops having a distance from the central transverse plane equal to or greater than 60% of the distance of said loops to the center of the instrument.

14. The array coil of claim 13, wherein the current amplitude and current phase is variable within one or more current loops relative to one or more other current loops.

15. A method for creating a uniform RF excitation field in a high-field magnetic resonance imaging instrument, said method comprising:
applying parallel RF excitation with an array coil, said array coil comprising:
at least four current loops, wherein if one unit of electric current flows through one or more of said loops, said one or more loops has a magnetic dipole moment, and for each loop the distance between the loop center and the central transverse plane of said instrument is smaller than 60% of the distance between the loop center and the center of said instrument; and wherein all of the conditions a, b, and c are met:
 a) at least three of said at least four current loops each have an axis which cannot be moved into a common plane without altering the direction of said axis by at least 35 degrees when the direction of the axis of one loop only is altered;
 b) each current loop has a position vector relative to the center of said instrument, and for at least one current loop the angular deviation of its axis is more than 20 degrees from the direction of its position vector; and,
 c) the axis of at least one current loop has an angular deviation of more than 22.5 degrees from the central transverse plane.

16. The method of claim 15, further comprising the step of varying both current amplitude and current phase in one or more current loops.

17. A high-field magnetic resonance imaging instrument comprising:
a superconducting magnet to immerse an object to be imaged in a magnetic field $B_0$;
a gradient coil to produce gradients in said $B_0$ magnetic field immersed in said object;
an RF coil to create a $B_1$ field to rotate the net magnetization of the object, said RF coil comprising:
at least four current loops, wherein if one unit of electric current flows through one or more of said loops, said one or more loops has a magnetic dipole moment, and for each loop the distance between the loop center and the central transverse plane of said instrument is smaller than 60% of the distance between the loop center and the center of said instrument; and wherein all of the conditions a, b, and c are met:
 a) at least three of said at least four current loops each have an axis which cannot be moved into a common plane without altering the direction of said axis by at least 35 degrees when the direction of the axis of one loop only is altered;
 b) each current loop has a position vector relative to the center of said instrument, and for at least one current loop the angular deviation of its axis is more than 20 degrees from the direction of its position vector; and,
 c) the axis of at least one current loop has an angular deviation of more than 22.5 degrees from the central transverse plane;
and,
a detector to detect signals from said object to be imaged.

18. The high-field magnetic resonance imaging instrument of claim 17, wherein the magnetic field strength is approximately 1.5 T.

19. The high-field magnetic resonance imaging instrument of claim 17, wherein the magnetic field strength is approximately 3.0 T.

20. The high-field magnetic resonance imaging instrument of claim 17, wherein the magnetic field strength is greater than 3.0 T.

* * * * *